United States Patent
Wang et al.

(10) Patent No.: US 7,688,616 B2
(45) Date of Patent: Mar. 30, 2010

(54) DEVICE AND METHOD OF PROGRAMMING A MAGNETIC MEMORY ELEMENT

(75) Inventors: Yu-Jen Wang, Hsinchu (TW);
Hsu-Chen Chang, Hsinchu (TW);
Denny Tang, Saratoga, CA (US)

(73) Assignee: Taiwan Semicondcutor Manufacturing Company, Ltd., Hsin-Chu (TW)

( * ) Notice: Subject to any disclaimer, the term of this patent is extended or adjusted under 35 U.S.C. 154(b) by 186 days.

(21) Appl. No.: 11/764,618

(22) Filed: Jun. 18, 2007

(65) Prior Publication Data
US 2008/0310214 A1    Dec. 18, 2008

(51) Int. Cl.
*G11C 11/00* (2006.01)
(52) U.S. Cl. ..................... 365/158; 365/173
(58) Field of Classification Search ............ 365/148, 365/158, 171, 173, 66, 97
See application file for complete search history.

(56) References Cited

U.S. PATENT DOCUMENTS

| | | | |
|---|---|---|---|
| 5,695,864 A | 12/1997 | Slonczewski | |
| 6,714,444 B2 | 3/2004 | Huai et al. | |
| 6,963,098 B2 | 11/2005 | Daughton et al. | |
| 6,980,469 B2 * | 12/2005 | Kent et al. | 365/171 |
| 7,307,876 B2 * | 12/2007 | Kent et al. | 365/171 |
| 2006/0054950 A1 | 3/2006 | Baek et al. | |
| 2006/0108625 A1 | 5/2006 | Lee et al. | |
| 2008/0112094 A1 * | 5/2008 | Kent et al. | 360/324.11 |
| 2008/0259508 A2 * | 10/2008 | Kent et al. | 360/324.11 |

OTHER PUBLICATIONS

Xiaochun Zhu et al., "Spin torque and field-driven perpendicular MRAM design scalable to multi-Gb/chip capacity," IEEE Trans. On Magnetic, vol. 42, Oct. 2006.
J.Z. Sun, "Current-Driven Magnetic Switching in Manganite Trilayer Junctions", Journal of Magnetism and Magnetic Materials, No. 202, 1999, pp. 157-162.
J.C. Slonczewski, "Current-Driven Excitation of Magnetic Multilayers", Journal of Magnestism and Magnetic Materials, 1996, pp. 1.1-1.7.

* cited by examiner

*Primary Examiner*—Gene N. Auduong
(74) *Attorney, Agent, or Firm*—Haynes and Boone, LLP

(57) ABSTRACT

Thus, the present disclosure provides a method of programming a memory array. At least one memory cell including a magnetic element is provided. At least one current source coupled to the magnetic element is provided. A unipolar current is supplied from the at least one current source to the magnetic element at a plurality of non-zero current levels.

20 Claims, 11 Drawing Sheets

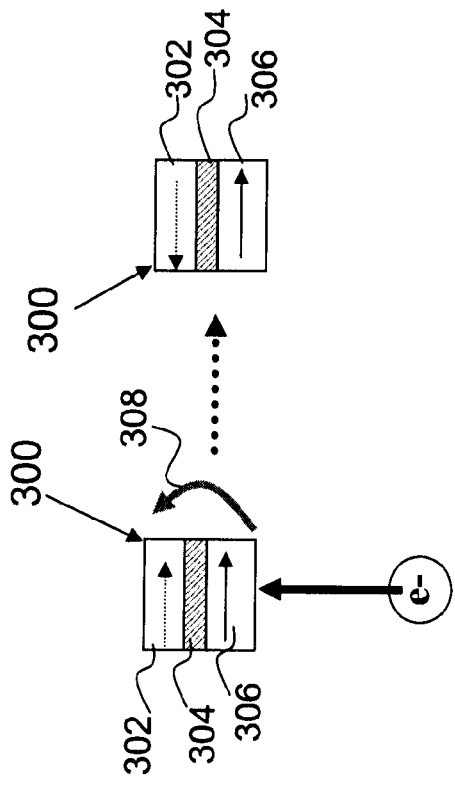
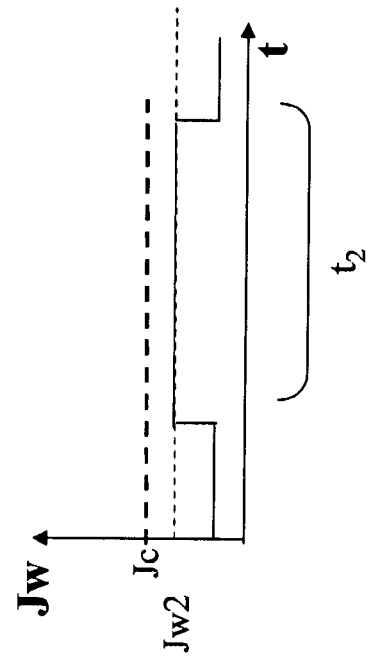
Fig. 3a
Fig. 3b
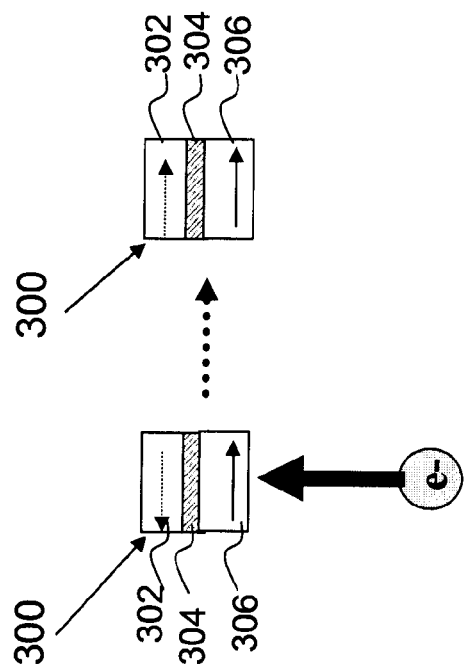
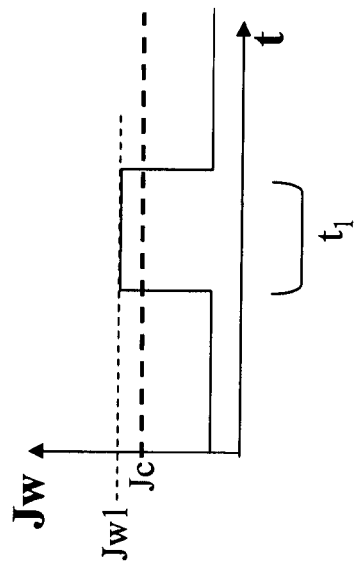
Fig. 3c
Fig. 3d

DEVICE AND METHOD OF PROGRAMMING A MAGNETIC MEMORY ELEMENT

BACKGROUND

The present disclosure relates generally to the field of nonvolatile memory devices, and more specifically to programming a magnetic element of a magnetic random access memory (MRAM) device.

MRAM is a nonvolatile memory technology that uses magnetization to represent stored data. MRAMs are beneficial in that they retain stored data in the absence of electricity. Generally, MRAM structure includes a plurality of magnetic cells in an array. Each cell generally represents one bit of data. Each cell includes at least one magnetic element. A magnetic element may include two ferromagnetic "plates" (e.g. layers upon a semiconductor substrate) each which has a magnetization direction (orientation of magnetic moments or direction of a magnetization vector) associated with it. The two ferromagnetic plates are separated by a thin non-magnetic layer. One of the ferromagnetic plates, the free layer (also known as a storage layer) has a magnetization vector that is free to rotate. The magnetization vector of other ferromagnetic plate, the pinned layer (also known as a reference layer) has a set, or "pinned" direction. In programming the magnetic element, typically, a "0" is written to a magnetic element by aligning the magnetization vectors of the ferromagnetic plates in a parallel manner and a "1" is written to a magnetic element by aligning the magnetization vectors of the ferromagnetic plates in an antiparallel manner. The magnetic element may be read by determining the resistance of the element. A magnetic element with parallel magnetization vectors of its ferromagnetic plates has a low resistance state. A magnetic element with antiparallel magnetization vectors of its ferromagnetic plates has a high resistance state.

The direction of magnetization of the free layer of the magnetic element may switched by introducing a current (a write current) to the magnetic element. One conventional manner of switching the magnetization direction of the free layer is spin torque transfer (STT), also known as spin transfer switching or spin-transfer effect or current induced magnetization switching (CIMS). STT is based on the idea that when a spin-polarized current is applied to a free layer the electrons may get repolarized because of the orientation of the magnetic moments of the free layer. The repolarizing of the electrons leads to the free layer experiencing a torque associated with the changed in the angular momentum of the electrons as they get repolarized. As a result, if the current density is high enough, this torque has enough energy to switch the direction of the magnetization vector of the free layer. STT has many advantages as known in the art, for example, smaller bit size, lower number of process steps as compared to other writing techniques, scalability for large arrays, and requiring a lower writing current. However, there is also a disadvantage in that STT requires a bidirectional current source. More specifically, switching from an antiparallel to a parallel configuration of the magnetization of a free layer and a pinned layer takes a current from a first direction while switching from a parallel configuration to an antiparallel direction takes a current from a second direction. In order to facilitate this bidirectional current, a current switch is necessary on the periphery of the array of cells including the magnetic elements. The presence of this switch increases the costs MRAM devices in terms of occupying device area, additional fabrication processes, complexity, and other costs known in the art.

As such, an improved method for programming a magnetic element and a memory device providing for improved programming of a magnetic element included in the device is desired.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 3a and 3b are cross-sections illustrating an embodiment of a magnetic element and programming said element. FIGS. 3c and 3d are graphs illustrating embodiments of writing clocks to be used with FIGS. 3a and 3b, respectively.

DETAILED DESCRIPTION

The present disclosure relates generally to MRAM devices and more particularly to programming a magnetic element of an MRAM device. It is understood, however, that specific embodiments are provided as examples to teach the broader inventive concept, and one of ordinary skill in the art can easily apply the teaching of the present disclosure to other methods or apparatus. In addition, it is understood that the methods and apparatus discussed in the present disclosure include some conventional structures and/or processes. Since these structures and processes are well known in the art, they will only be discussed in a general level of detail. Furthermore, reference numbers are repeated throughout the drawings for sake of convenience and example, and such repetition does not indicate any required combination of features or steps throughout the drawings. Moreover, the formation of a first feature over and on a second feature in the description that follows may include embodiments in which the first and second features are formed in direct contact, and may also include embodiments in which additional features may be formed interposing the first and second features, such that the first and second features may not be in direct contact.

Figure 1:
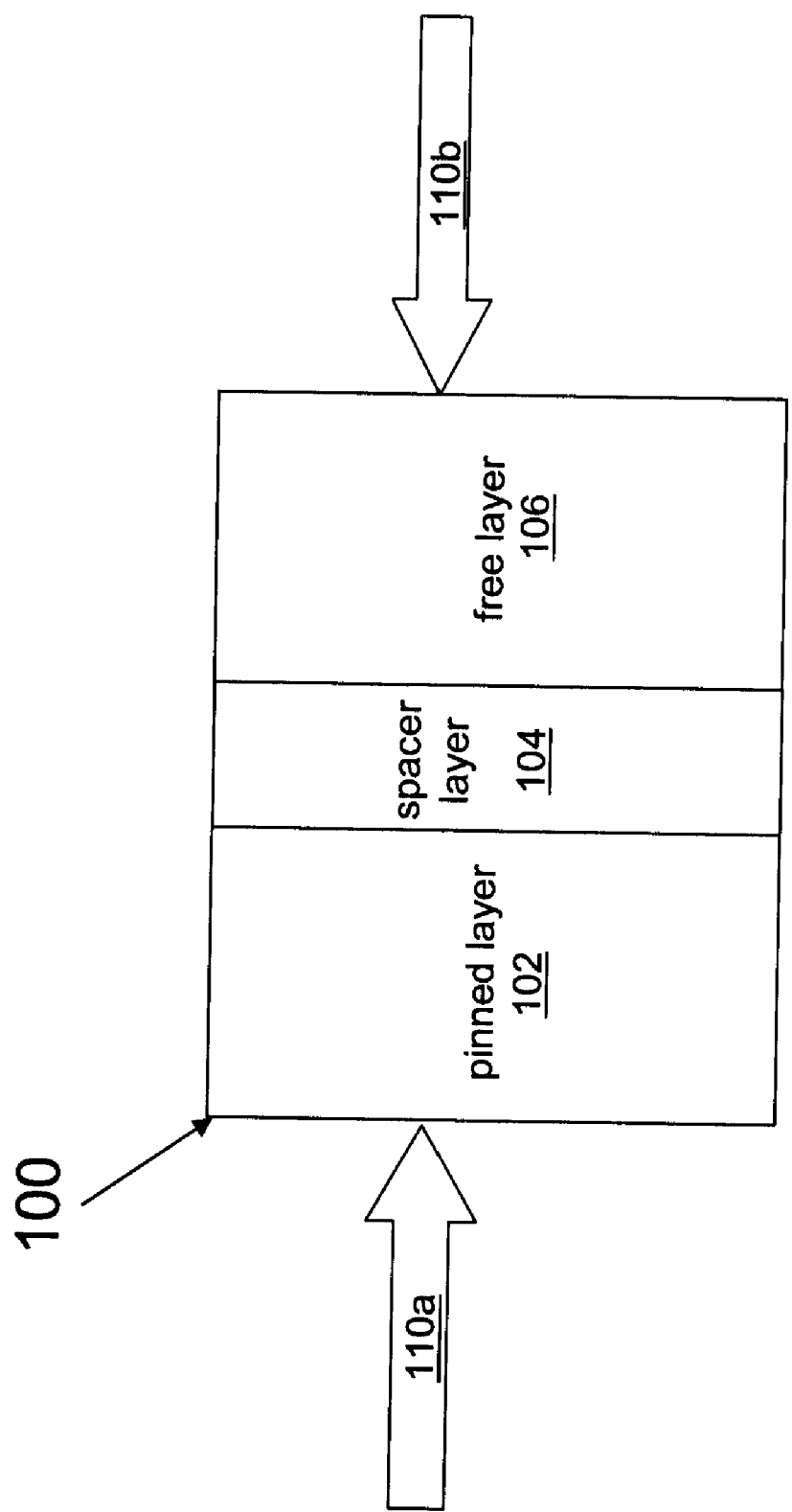
FIG. 1 is a cross-section illustrating an embodiment of a magnetic element.

Referring to FIG. 1, illustrated is an embodiment of a magnetic element 100. The magnetic element 100 includes a pinned layer 102, a non-magnetic spacer layer 104, and a free layer 106. In a first embodiment, the magnetic element 100 is a magnetic tunnel junction (MTJ) element as the spacer layer 104 is an insulator or barrier layer sandwiched between a free magnetic element (the free layer 106) and a fixed magnetic element (the pinned layer 102). In a second embodiment, the magnetic element 100 is a giant magnetoresistance (GMR) element as the spacer layer 104 is a non-magnetic, conductive layer sandwiched between a free magnetic element (the free layer 106) and a fixed magnetic element (the pinned layer 102). Other embodiments are possible.

The pinned layer 102 and the free layer 106 are ferromagnetic layers. The pinned layer 102 and the free layer 106 may include Co, Fe, B, Ni, Mn, and/or their alloys, including for example, NiFe, NiFe, CoFe, CoFeB, or compounds thereof, including other ferromagnetic materials. The pinned layer 102 and/or the free layer 106 may be formed by conventional processes such as, photolithography, chemical vapor deposition (CVD), physical vapor deposition (PVD), electrochemical deposition, molecular manipulation, etching, chemical mechanical polish, and/or other processes. The pinned layer 102 and the free layer 106 are illustrated in FIG. 1 as single layers; however, as known in the art, either layer may be synthetic (e.g. ferromagnetic layer/spacer layer/ferromagnetic layer).

The spacer layer 104 may also be formed by conventional processes such as, photolithography, chemical vapor deposition (CVD), plasma enhanced chemical vapor deposition (PECVD), physical vapor deposition (PVD), electrochemical deposition, molecular manipulation, oxidation, etching, chemical mechanical polishing, and/or other processes known in the art.

In one embodiment, the magnetic element 100 is a MTJ element (also known as a tunneling magnetoresistance (TMR) element). In the embodiment, the spacer layer 104 is a barrier layer (also known as tunneling barrier). The thickness of the spacer layer 104 is such that the electrons are capable of "tunneling" through the layer. In the embodiment, the spacer layer 104 has a non-magnetic composition and can be formed from any suitable material that functions as an electrical insulator. Examples of other insulating materials that may be included in the spacer layer 104 include oxides or nitrides of Al, Mg, Si, Hf, Sr, or Ti such as, $SiO_x$, $SiN_x$, $SiO_xN_y$, $AlO_x$, $TO_x$, $TiO_x$, $AlN_x$, and/or combinations thereof. The spacer layer 104 may electrically insulate the pinned layer 102 from the free layer 106 independently, or in conjunction with other layers (not illustrated) interposing the pinned layer 102 and the free layer 106.

In another embodiment, the magnetic element 100 is a GMR element. In the embodiment, the spacer layer 104 is comprised of a non-magnetic, conductive material. The barrier layer 104 may include conductive materials such as Cu, Ru, Ni, and/or other conductive materials known in the art. The spacer layer 104 is of a thickness that allows the orientation of the magnetic moments of the free layer 106 to be switched by spin torque transfer.

The magnetic element 100 may contain additional layers including additional pinned layers, antiferromagnetic layers (pinning layers), seed layers, capping layers, spacer layers and/or other layers known in the art. One or more the layers may be synthetic. In an embodiment, the magnetic element 100 contains an antiferromagnetic layer. The antiferromagnetic layer has magnetic moments pointing in multiple directions and as such, the layer is insensitive to magnetic fields. Therefore, the antiferromagnetic layer can set, or "pin" the direction of a ferromagnetic layer, such as the pinned layer 202c.

The magnetic element 100 may be formed on a substrate, such as a semiconductor substrate including silicon, germanium, a compound semiconductor, and/or other materials known in the art. The magnetic element 100 may be coupled to one or more interconnects operable to provide a current, such as a read current and/or a write current, to the magnetic element 100. The interconnects may be formed of material suitable of conducting electricity, such as Al, Cu, Au, Ag, Ta, and/or combinations thereof.

The magnetic element 100 architecture allows the magnetization of the free layer 106 to be switched using spin-torque transfer (STT). The following description of STT applied to the magnetic element 100 is based upon the current state of the art for reference only and not intended to be limiting the scope of the current disclosure. The following description of STT uses current perpendicular to the plane (CPP) configuration. In CPP configuration, the current is driven perpendicular to the layers of the magnetic element 100. The magnetization of the free layer 106 is assumed initially antiparallel to the pinned layer 102. Current, illustrated as arrow 110b, can be supplied from the free layer 106 toward the pinned layer 102 to switch the magnetization of the free layer 106 to be parallel to the magnetization of the pinned layer 102. When current is driven from the free layer 106 to the pinned layer 102 (in the direction of arrow 110b), conduction electrons travel from the pinned layer 102 to the free layer 106. The majority electrons traveling from the pinned layer 102 have their spins polarized in the same direction as the magnetic moments of the pinned layer 102. These electrons interact with the magnetic moments of the free layer 106 near the interface between the free layer 106 and the barrier layer 104. Because of this interaction, the electrons transfer their spin angular momentum to the free layer 106. This spin angular momentum is antiparallel to the magnetization of the free layer 106. If sufficient angular momentum is transferred by the electrons, the magnetization of the free layer 106 can be switched to be parallel to the magnetization of the pinned layer 102. The critical current density required to switch the magnetization direction of the free layer is denoted as Jc. When the free layer 106 has a magnetization parallel to that of the pinned layer 102, the resistance of the magnetic element 100 is low. Typically, this low resistance state is arbitrarily designated as storing a value of "0."

Alternatively, current can be supplied from the opposite direction, illustrated as arrow 110a, from the pinned layer 102 to the free layer 106. Current from the direction of arrow 110a switches the magnetization of the free layer 106 to be antiparallel to the magnetization of the pinned layer 102. The magnetization of the free layer 106 is assumed parallel to that of the pinned layer 102 prior to applying the current. When the current is driven from the pinned layer 102 to the free layer 106 (in the direction of arrow 110a), conduction electrons travel in the opposite direction. The majority electrons have their spins polarized in the direction of the magnetization of the free layer 106 (the same direction as the pinned layer 102). These majority electrons are transmitted through the pinned layer 102. However, the minority electrons, which have spins polarized antiparallel to the magnetization of the free layer 106 and the pinned layer 102, will be reflected from the pinned layer 102 and travel back to the free layer 106. The minority electrons reflected interact with the magnetic moments of the free layer 106 and transfer a portion of their spin angular momentum to the free layer 106. If sufficient angular momentum is transferred, the magnetization of the free layer 106 can be switched to be antiparallel to the magnetization of the pinned layer 102. The critical current density required to switch the magnetization direction of the free layer is denoted Jc. When the free layer 106 is antiparallel to the pinned layer 102, the resistance of the magnetic element 100 is higher. Typically, this high resistance state is arbitrarily designated as storing a value of "1."

However, the need for this bidirectional current required for STT described above requires the provision of a current switch, which may add costs to the provision of the memory element. As such, switching the magnetization of the free layer 106 using a unipolar current is desired. Such a technique is discussed herein.

Figure 2:
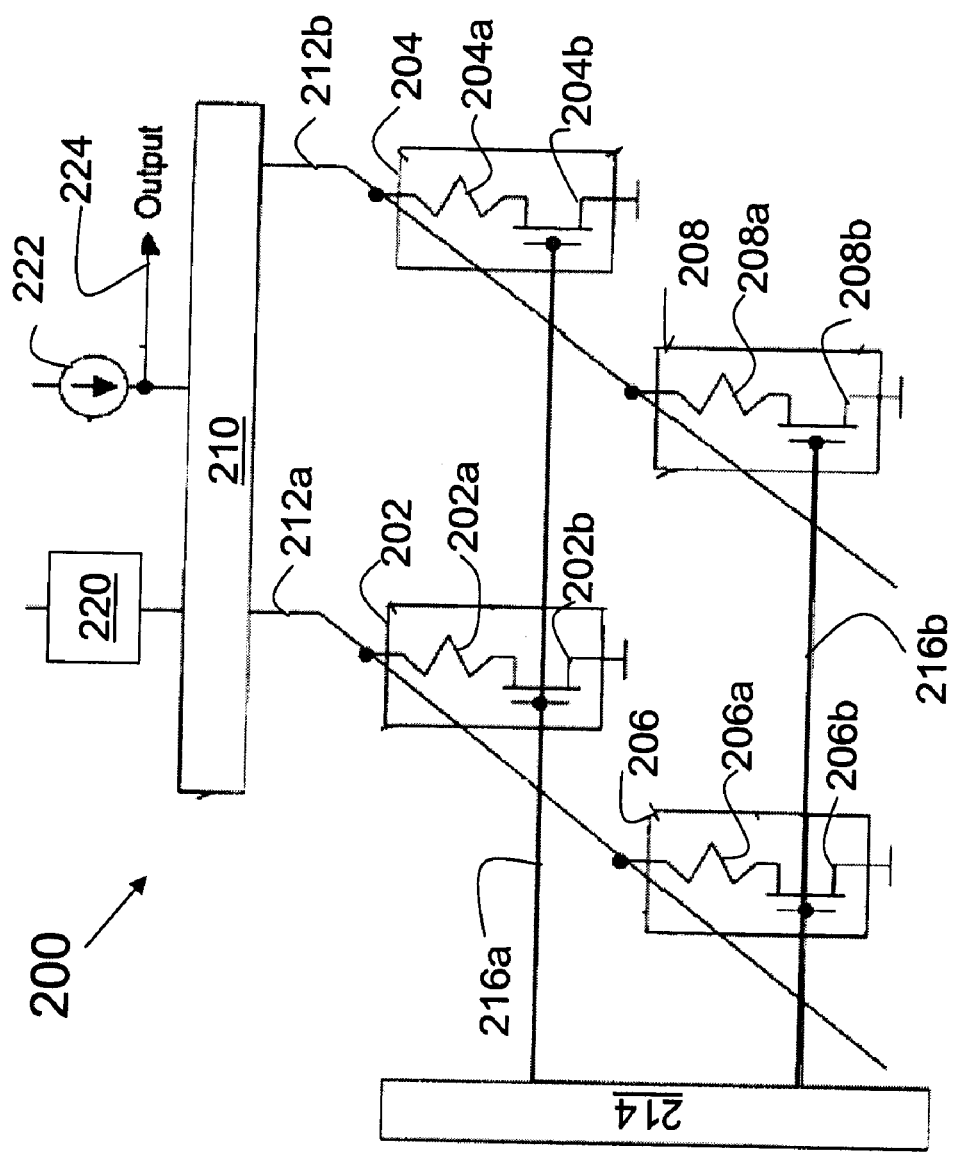
FIG. 2 is a circuit diagram illustrating an embodiment of a magnetic memory array.

Referring now to FIG. 2, a circuit diagram illustrates one embodiment of a magnetic memory array 200. The magnetic memory array 200 as illustrated includes four (4) memory cells 202, 204, 206, and 208. Each memory cell 202, 204, 206, and 208 includes a magnetic element 202a, 204a, 206a, and 208a and a transistor 202b, 204b, 206b, and 208b respectively. The magnetic elements 202a, 204a, 206a, and 208a are depicted as resistors for the purpose of FIG. 2. The magnetic elements 202a, 204a, 206a, and 208a may include magnetic elements such as magnetic element 100, described above in reference to FIG. 1. For instance, in an embodiment, one or more of the magnetic elements 202a, 204a, 206a, and 208a include a MTJ element. In an alternative embodiment, one or more of the magnetic elements 202a, 204a, 206a, and 208a include a GMR element. The magnetic elements 202a, 204a, 206a, and 208a may be written to using spin torque transfer (STT).

Each of the memory cells 202, 204, 206, and 208 are coupled to reading/writing column selection 210 via bit lines 212a and 212b respectively and to row selection 214 via word lines 216a and 216b respectively. The reading/writing column selection 210 is coupled to a write current source 220 and a read current source 222. To read from a memory cell 202, 204, 206, or 208, a read current from the read current source 222 is supplied. The memory cell 202, 204, 206, or 208 selected to be read is determined by the row selector 214 and the column selector 210. The output voltage is read at the output line 224 and used to determine the resistive state of the magnetic element 202a, 204a, 206a, and/or 208a.

Because the magnetic elements 202a, 204a, 206a, and 208a operate by spin torque transfer, the magnetic element array 200 does not include conventional write lines. The magnetic elements 202a, 204a, 206a, and 208a are written to by the introduction of a current from the write current source 220. In a conventional memory array, the write current source 220 includes a current switch that provides a bidirectional current. The current switch allows a current to be supplied from two directions when programming the magnetic elements 202a, 204a, 206a, and 208a using the conventional spin torque transfer method described above in reference to FIG. 1. For example, a current would be sent in a first direction to switch a free layer of the magnetic elements 202a, 204a, 206a, and/or 208a to be parallel a pinned layer and give low resistance state of the magnetic element 202a, 204a, 206a, and/or 208a. A current would be sent in a second direction to switch a free layer of the magnetic elements 202a, 204a, 206a, and/or 208a to be antiparallel the pinned layer and give a high resistance state of the magnetic elements 202a, 204a, 206a, and/or 208a.

This disclosure however provides for a current source 220 that allows a unipolar (or unidirectional) current to program the magnetic elements 202a, 204a, 206a, and/or 208a. The current source 220 is such that it provides a unipolar current including at least two levels of current each with a different current density. In an embodiment, the current source 220 may include two transistors. When a first transistor is turned on a current of a first current density is provided. When a second transistor is turned on, a current of a second current density is provided. The current source 220 may include a plurality of distinct current sources each providing a current to program the magnetic elements 202a, 204a, 206a, and/or 208a, the currents being unidirectional.

Referring now to FIGS. 3a, 3b, 3c, and 3d, a magnetic element 300 is illustrated in FIGS. 3a and 3b; write clocks illustrating write current density (Jw) versus time (t) are illustrated in FIGS. 3c and 3d. The write clock of FIG. 3c is associated with the magnetic element 300 as illustrated in FIG. 3a; the write clock of FIG. 3d is associated with the magnetic element 300 as illustrated in FIG. 3b. The magnetic element 300 includes a free layer 302, a pinned layer 306, and a spacer layer 304. The magnetic element 300 may be substantially similar to the magnetic element 100, described above with reference to FIG. 1. The direction of magnetization of each of the layers is depicted as an arrow included in the layer. The pinned layer 306 has a non-zero magnetization to offer a bias field as described below. The magnetic element 300 may include additional layers including for example, additional pinned layers, spacer layers, pinning layers, seed layers, capping layers, and/or other layers known in the art. One or more layers may be synthetic. In an embodiment, the magnetic element 300 includes a thermal assistance layer. The thermal assistance layer is comprised of a high resistivity material such as, W, TaN, and/or other materials known in the art. The magnetic element 300 is configured to allow the magnetization of the free layer 302 to be switched using STT.

In FIG. 3a, the magnetization of the free layer 302 is initially antiparallel the magnetization of the pinned layer 306. A current, Jw1, is supplied to the magnetic element 300 as shown by the arrow illustrating the direction of injection of electrons (e−) (the current direction is opposite, the current Jw1 being supplied to the magnetic element 300 from the free layer 302 towards the pinned layer 306). As illustrated by the write clock of FIG. 3c, Jw1 is a current greater than Jc. As illustrated above in the discussion of STT of magnetic element 100, the magnetization of the free layer 302 may be switched to be parallel to the magnetization of the pinned layer 306 by a current such as Jw1. The current Jw1 is supplied to the magnetic element 300 for a time t1. The time t1 is dependent upon the thickness of the spacer layer 304. In an embodiment, t1 is no greater than approximately five (5) nanoseconds. In an alternative embodiment, t1 is no greater than approximately 150 nanoseconds. In the embodiment, the spacer layer 304 has a thickness between approximately 0.1 nm and 10 nm.

In FIG. 3b, the magnetization of the free layer 302b is initially parallel the magnetization of the pinned layer 306b. A current, Jw2, is supplied to the magnetic element 300 as shown by the arrow illustrating the direction of the injection of electrons (e−) (the current flow is opposite, the current Jw2 also being supplied to the magnetic element 300 from the free layer 302 towards the pinned layer 306). The Jw2 current flow is from the same direction as the current flow Jw1 (the currents are unipolar). As illustrated by the write clock of FIG. 3d, Jw2 is less than Jc. Jw2 is less than Jw1. In an alternative embodiment, Jw2 may be equal to Jw1. The current Jw2 is supplied to the magnetic element 300b for a time t2. The time t2 may be no greater than approximately 250 nanoseconds. In an embodiment, the time t2 is no greater than approximately 150 nanoseconds. In an alternative embodiment, the time t2 is no greater than approximately 50 nanoseconds. In an embodiment, the ratio of t2/t1 is no greater than approximately 200. In an embodiment, t1 is approximately equal to t2. In an embodiment, the radio of t2/t1 is greater than approximately 5.

As the current Jw2 is applied, the magnetic element 300 and the free layer 302 in particular, are heated. As the temperature of the free layer 302 rises, the Hc (the intensity of the magnetic field required to reduce the magnetization of the free layer 302 to zero after being driven to saturation in the direction parallel the pinned layer 306) will be reduced. As Hc decreases, the free layer 302 becomes easier to rotate. When Hc becomes sufficiently small, the free layer 302 may be rotated by the bias field 308 of the pinned layer 306. In an embodiment, Hc is less than approximately 20 Oe before the free layer can be rotated by the bias field 308. The dependence of the Hc of the free layer 302 on temperature is dependant upon the magnetic element 300 shape, the composition of the free layer 302, the thickness of the free layer 302, and/or other factors known in the art. The bias field 308 strength is dependant upon the pinned layer 306 composition, the pinned layer 306 thickness, and/or other factors known in the art. In the embodiment, the magnetization of the free layer 302 is switched to be antiparallel the magnetization of the pinned layer 306.

Referring now to FIGS. 3e, 3f, 3g, 3h, 3i, 3j, and 3k illustrated is a memory array 320a/320b/320c and a plurality of writing clocks 322, 324, 326, and 328. The memory array 320a, illustrated in FIG. 3e, references the array in its original state. The original state corresponds to the state of the memory elements (cells) included in the array at the time period marked "a" on the writing clocks 322, 324, 326, and 328. The memory array 320b, illustrated in FIG. 3j, references the array in an interim state. The interim state corresponds to the state of the memory elements included in the array at the time period marked "b" on the writing clocks 322, 324, 326, and 328. The memory array 320c, illustrated in FIG. 3k, references the array in a final state. The final state corresponds to the state of the memory elements included in the array at the time period marked "c" on the writing clocks 322, 324, 326, and 328. The memory array 320a, 320b, 320c includes write lines 322a, 324a, 326a, and 328a and word lines 330, 332, 334, and 336. The memory array 320a, 320b, 320c includes a plurality of memory elements (e.g. memory cells), illustrated as 0 or 1 at the intersection of the write line and word line and designated as row (write line)/column (read line) (e.g. 322a/330). The memory elements may be substantially similar to the memory element 300, illustrated above in reference to FIGS. 3a and 3b. The word lines 332 and 336 are turned "off" in the illustrated embodiment, and as such the state of the memory elements coupled to the word lines 332 and 336 may not be switched. The final state 320c however is dependent on the clock of the word lines 330, 332, 334, and 336. As such, in other embodiments, the final state 320c may differ.

Figure 3E:
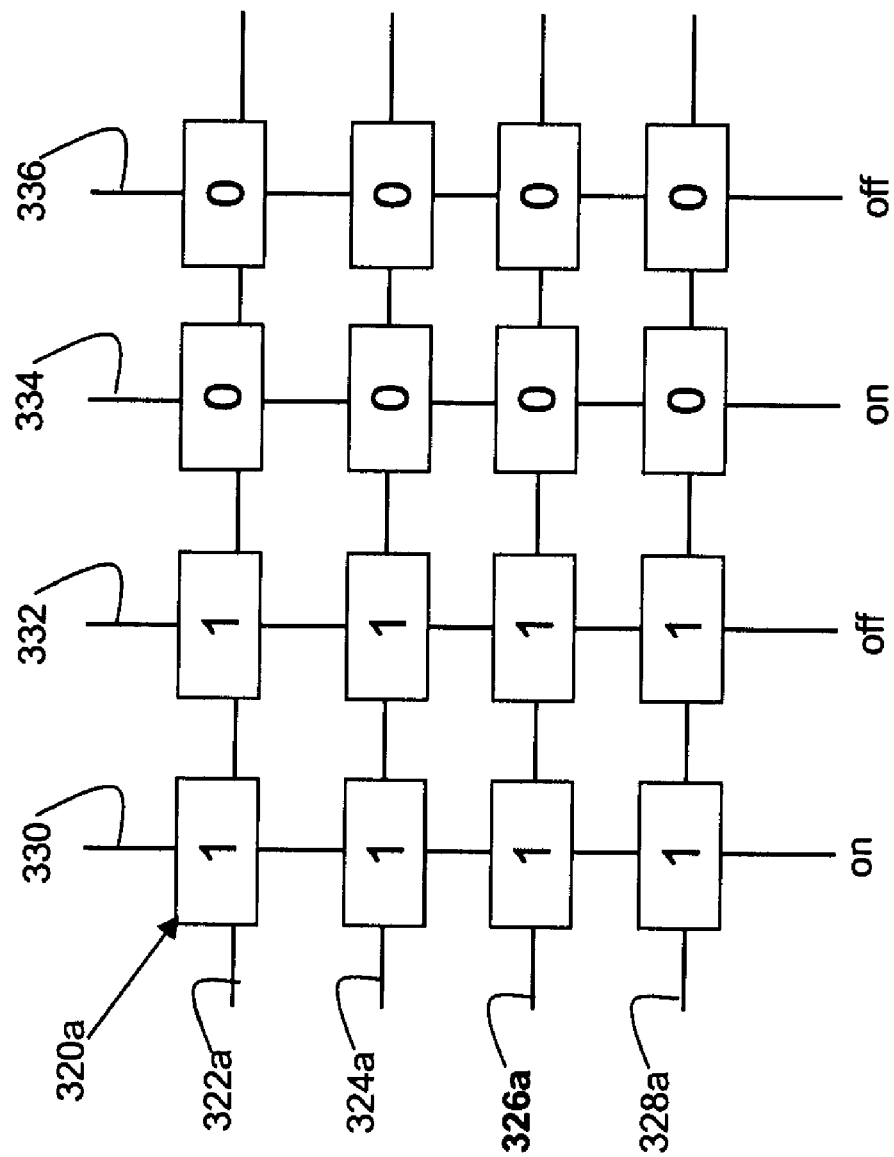
FIGS. 3e, 3j, and 3k are diagrams illustrating an embodiment of a memory array including various memory states.
Figure 3H:
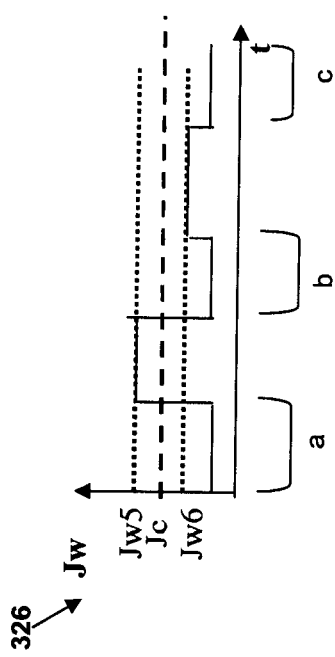
FIGS. 3f, 3g, 3h, and 3i include a plurality of graphs illustrating writing clocks used with the memory array of FIGS. 3e, 3j, and 3k.
Figure 3I:
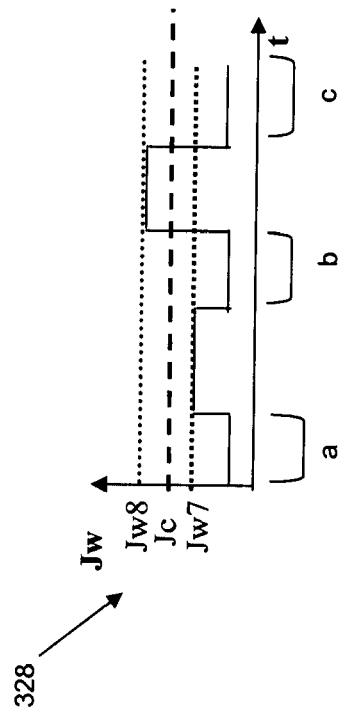
Figure 3F:
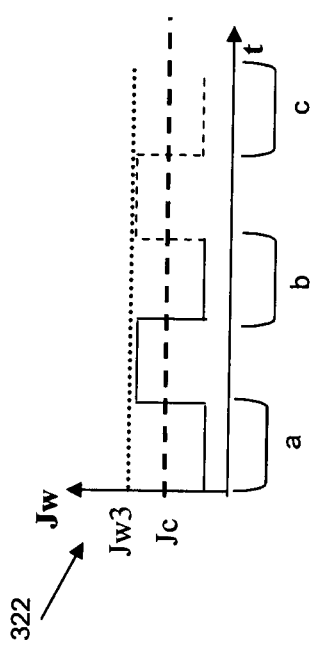

A current according to the write clock 322 of FIG. 3f is applied to the memory array 320a of FIG. 3e via the write line 322a. The write clock 322 includes one or more current pulses having a current density of Jw3. Jw3 is greater than Jc. Thus, a current of Jw3 is applied to the memory elements found at the array locations 322a/330 and 334/322a. The write current Jw3 is operable to switch the memory state of the memory element 322a/330 from a state of storing a "1" to a state of storing a "0" as illustrated in the interim state of the memory array 320b in FIG. 3j. The switching of the memory state may be substantially similar to that described above in reference to FIGS. 3a and 3c. The application of another current pulse having a current density of Jw3 as illustrated in write clock 322 by dashed lines, does not further alter the state of the memory array. Thus the final state 320c of the memory elements of the write line 322a is 0, 1, 0, 0, as illustrated in FIG. 3k.

Figure 3G:
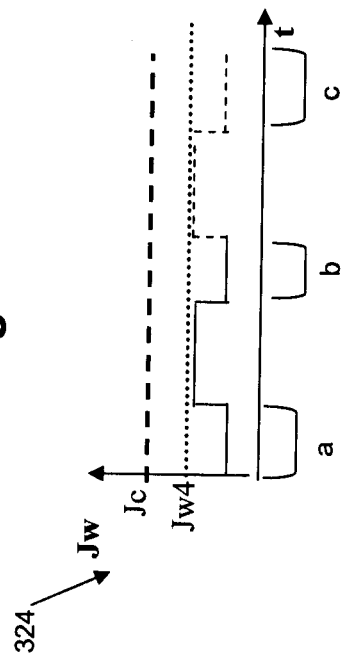
Figure 3J:
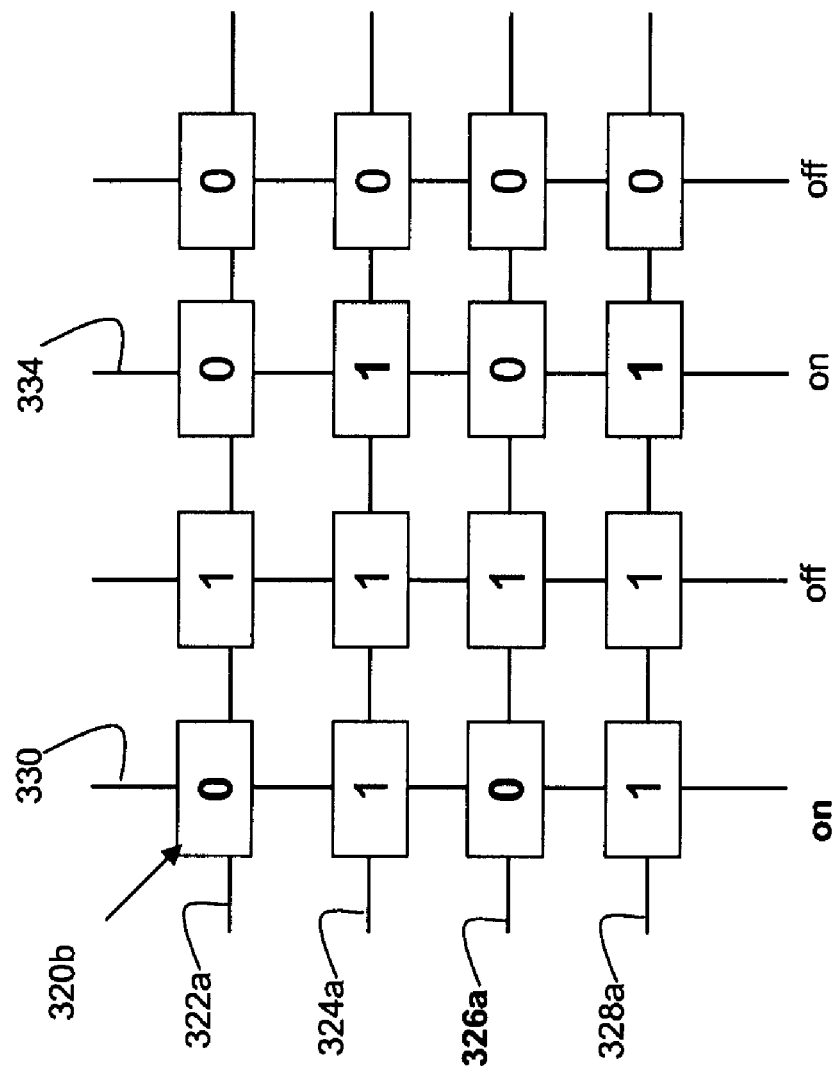
Figure 3K:
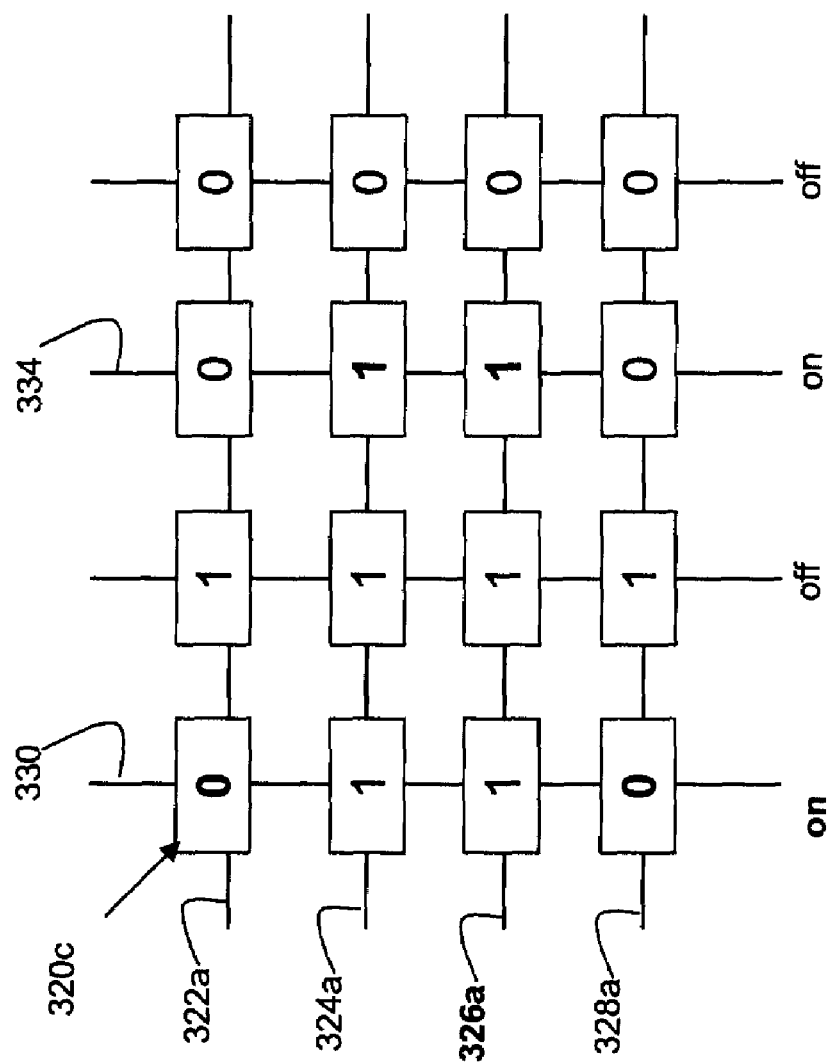

A current according to the write clock 324 of FIG. 3g is applied to the memory array 320a of FIG. 3e via the write line 324a. The write clock 324 includes one or more current pulses having a current density of Jw4. Jw4 is less than Jc. Thus, a current of Jw4 is applied to the memory elements found at the array locations 324a/330 and 324a/334. The write current Jw4 is operable to switch the memory state of the memory element 324a/334 from a state of storing a "0" to a state of storing a "1" as illustrated in the interim state of the memory array 320b in FIG. 3j. The switching of the memory state may be substantially similar to that described above in reference to FIGS. 3b and 3d. The application of another current pulse having a current density of Jw4 as illustrated in write clock 324 by dashed lines, does not further alter the state of the memory array. Thus the final state 320c of the memory elements of the write line 324a is 1, 1, 1, 0, as illustrated in FIG. 3k.

A current according to the write clock 326 of FIG. 3h is applied to the memory array 320a via the write line 326a. The write clock 326 includes a first current pulse having a current density of Jw5 and a second current pulse having a density of Jw6. Jw5 is greater than Jc; Jw6 is less than Jc. First a current of Jw5 is applied to the memory elements found at the array locations 326a/330 and 326a/334. The write current Jw5 is operable to switch the memory state of the memory element 326a/330 from a state of storing a "1" to a state of storing a "0" as illustrated in the interim state of the memory array 320b in FIG. 3j. The switching of the memory state may be substantially similar to that described above in reference to FIGS. 3a and 3c. Second, a current of Jw6 is applied to the memory elements now having the interim memory state 320b illustrated in FIG. 3j. The write current Jw6 is operable to switch the memory state of the interim memory array 320b such that the memory elements 326a/330 and 326a/334 are switched from a state of storing a "0" to a state of storing a "1" as illustrated by the final state of the memory array 320c in FIG. 3j. The switching of the memory states from a "0" to a "1" may be substantially similar to that described above in reference to FIGS. 3b and 3d. Thus the final state 320c of the memory elements comprising the write line 326a is 1, 1, 1, 0, as illustrated in FIG. 3k.

A current according to the write clock 328 of FIG. 3i is applied to the memory array 320a via the write line 328a. The write clock 328 includes a first current pulse having a current density of Jw7 and a second current pulse having a density of Jw8. Jw7 is less than Jc; Jw8 is greater than Jc. First a current of Jw7 is applied to the memory elements found at the array locations 328a/330 and 328a/334. The write current Jw7 is operable to switch the memory state of the memory element 328a/334 from a state of storing a "0" to a state of storing a "1" as illustrated in the interim state of the memory array 320b in FIG. 3j. The switching of the memory state may be substantially similar to that described above in reference to FIGS. 3b and 3d. Second, a current of Jw8 is applied to the memory elements now having the interim memory state illustrated in FIG. 3j. The write current Jw8 is operable to switch the memory state of the interim memory array 320b such that the memory elements 328a/330 and 328a/334 are switched from a state of storing a "1" to a state of storing a "0" as illustrated by the final state of the memory array 320c in FIG. 3j. The switching of the memory states from a "1" to a "0" may be substantially similar to that described above in reference to FIGS. 3a and 3c. Thus the final state 320c of the memory elements of the write line 324a is 0, 1, 0, 0, as illustrated in FIG. 3k.

Figure 4B:
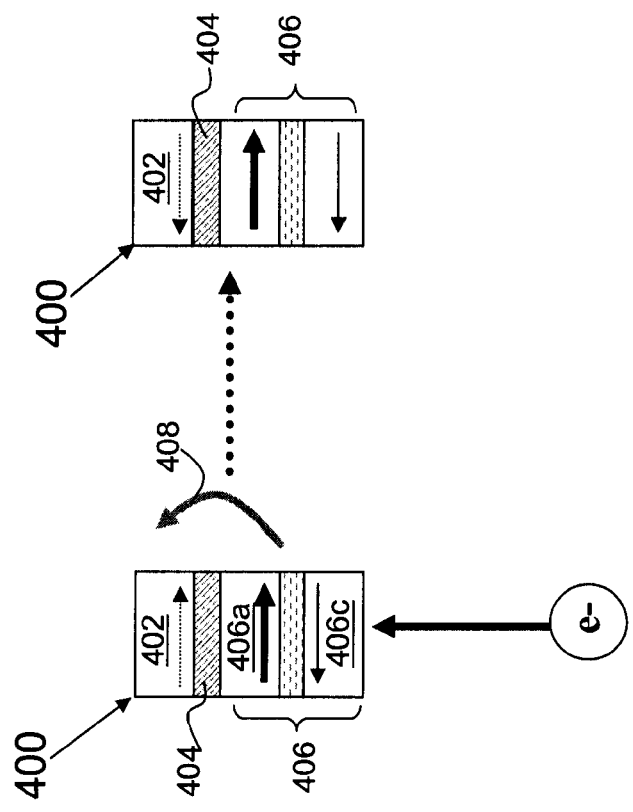
FIGS. 4a and 4b are cross-sections illustrating an alternative embodiment of a magnetic element and programming said element.
Figure 4A:
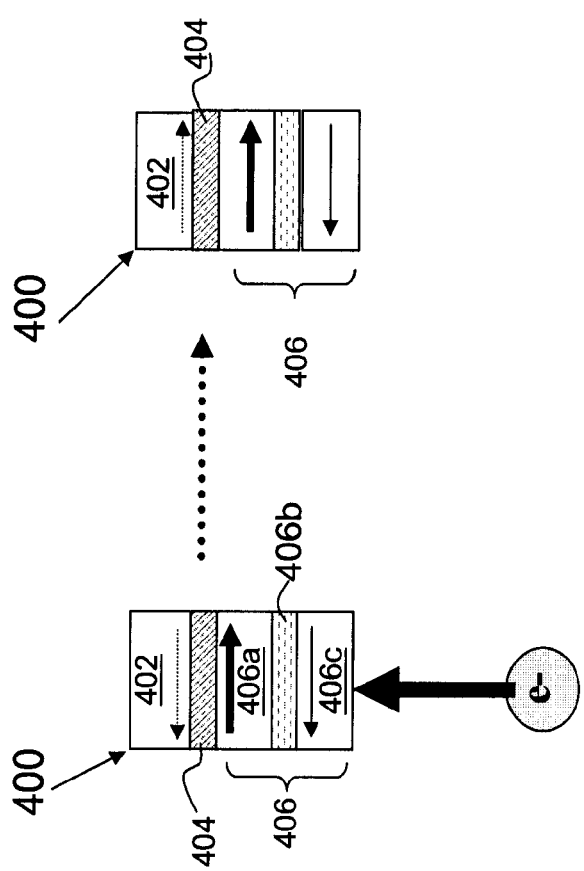

Referring now to FIGS. 4a and 4b, a magnetic element 400 is illustrated. The magnetic element 400 includes a free layer 402, a spacer layer 404, and a synthetic antiferromagnet (SAFM) 406. The SAFM 406 is a synthetic pinned layer performing similar functions as the pinned layer 102 described above. The SAFM 406 includes two ferromagnetic layers 406a and 406c separated by a spacer layer 406b. The ferromagnetic layers 406a and 406c may include Co, Fe, Ni, and/or their ferromagnetic alloys such as NiFe, CoFe, and/or CoNiFe. The layers may also comprise half-metallic ferromagnets such as, $CrO_2$, NiMnSb, and/or PtMnSb. The spacer layer 406b includes a non-magnetic, conductive material. In an embodiment, the spacer layer comprises Ru. Other examples of material that may be included in the spacer layer 406b include Ir and Re. The thickness of the spacer layer 406b is such that the ferromagnetic layers 406a and 406c are antiferromagnetically coupled. The free layer 402 and the spacer layer 404 may be substantially similar to the free layer 102 and the spacer layer 104, described above with reference to FIG. 1. The magnetic element 400 is configured to allow the magnetization of the free layer 402 to be switched using STT.

FIG. 4a illustrates programming the magnetic element 400 by spin torque transfer (STT). The magnetization of the free layer 402 is initially antiparallel the magnetization of the ferromagnetic layer 406a of the SAFM 406. A current is supplied to the magnetic element 400 from the free layer 402 towards SAFM 406 as illustrated by the arrow into the SAFM 406 illustrating the injection of electrons (e−). The current supplied has a current density greater than Jc. The current switches the direction of magnetization of the free layer 402 by STT.

In FIG. 4b, the free layer 402 is initially parallel the magnetization of the ferromagnetic layer 406a. A current is supplied to the magnetic element 400 from the free layer 402 towards the SAFM 406 as shown by the arrow into ferromagnetic layer 406c illustrating the injection of electrons (e−). The current supplied may have a current density less than Jc. The current supplied is unipolar with the current supplied to the magnetic element 400 in FIG. 4a. The current is supplied for sufficient time to heat the magnetic element 400 and in particular, the free layer 402 until the Hc of the free layer 402 is sufficiently low that the magnetization of the free layer 402 becomes dependent on the bias field 408 of the SAFM 406. This switches the magnetization of the free layer 402 to be antiparallel the ferromagnetic layer 406a of the SAFM 406.

Figure 5B:
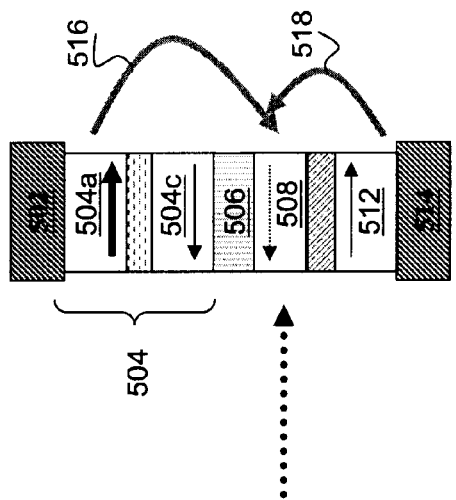
FIGS. 5a and 5b are cross-sections illustrating an alternative embodiment of a magnetic element and programming said element.
Figure 5B:
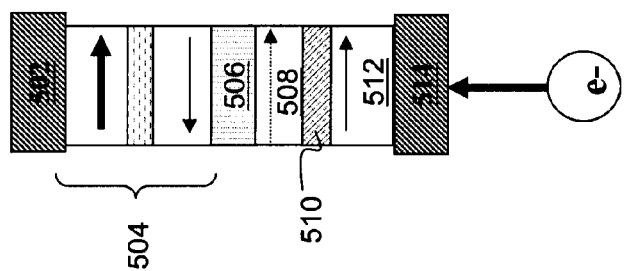
Figure 5A:
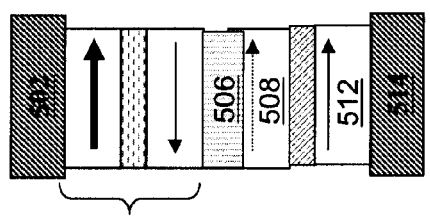
Figure 5A:
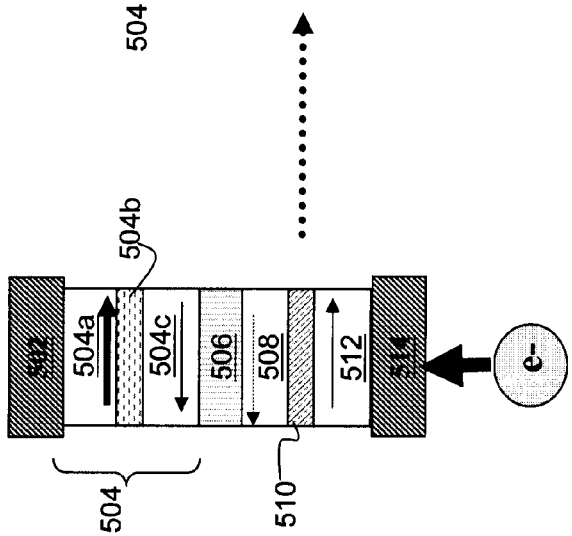

Additional reference layers may be included in magnetic elements such as, magnetic elements 100, 300, and 400 described above with reference to FIGS. 1, 3a, 3b, 4a, and 4b. The additional reference or pinned layers may increase the net bias field available for switching a free layer. The additional pinned layers may be magnetic field bias layers. Referring now to FIGS. 5a and 5b, an embodiment of a magnetic element 500 is illustrated. The magnetic element 500 includes a plurality of pinned layers including a SAFM 504 and a pinned layer 512. The magnetic element 500 further includes antiferromagnets (AFM) 502 and 514, a free layer 508, a spacer layer 510, and a second spacer layer 506.

The SAFM 504 includes two ferromagnetic layers 504a and 504c separated by a spacer layer 504b. The SAFM 504 may be substantially similar to the SAFM 406, described above with reference to FIG. 4. The SAFM 504 is a magnetic field bias layer. The free layer 508, the pinned layer 512, and the spacer layer 510 may be substantially similar to the free layer 102, the pinned layer 106, and the spacer layer 104 respectively, described above in reference to FIG. 1. The AFMs 502 and 514 includes antiferromagnetic material. In an embodiment, the AFM 502 and 514 include PtMn. Examples of other antiferromagnetic materials that may be included in the AFMs 502 and/or 514 include NiMn, PdMn, and IrMn. The AFM 502 sets or "pins" the direction of magnetization of the SAFM 504. The AFM 514 sets or "pins" the direction of magnetization of the pinned layer 512. The AFMs 502 and 514 may be formed by conventional processes such as, photolithography, chemical vapor deposition (CVD), physical vapor deposition (PVD), electrochemical deposition, molecular manipulation, etching, CMP, and/or other processes known in the art. The magnetic element 500 is configured to allow the magnetization of the free layer 508 to be switched by STT.

FIG. 5a illustrates an embodiment of programming the magnetic element 500 by spin torque transfer. The magnetization of the free layer 508 is initially antiparallel the magnetization of the ferromagnetic layer 504a of the SAFM 504 and the pinned layer 512. A current is supplied to the magnetic element 500 in a direction from the AFM 502 towards the AFM 514 as shown by the arrow into the AFM 514 illustrating the injection of electrons (e−). The current supplied has a current density greater than Jc. The current switches the direction of the magnetization of the free layer 508 by STT to be parallel the magnetization of the ferromagnetic layer 504a of the SAFM 504 and the pinned layer 512.

In FIG. 5b, the magnetization of the free layer 512 is initially parallel the magnetization of the ferromagnetic layer 504a of the SAFM 504 and the pinned layer 512. A current is supplied to the magnetic element 500 in a direction from the AFM 502 towards the AFM 514 as shown by arrow into the AFM 514 illustrating the injection of electrons (e−). The current supplied may have a current density that is less than Jc. The current is supplied for sufficient time to heat the magnetic element 500 and in particular, the free layer 508 until the Hc of the free layer 508 is sufficiently low that the magnetization of the free layer 508 becomes dependent on the bias fields 516 and 518 present. The bias field 516 develops from the pinned layer 512. The bias field 518 develops from the ferromagnetic layer 504a of the SAFM 504. The magnetization of the free layer 508 will then switch directions to be antiparallel the ferromagnetic layer 504a of the SAFM 504 and the pinned layer 512. Thus, this form of thermal programming depicted in FIG. 5b allows the use of the current to be unipolar with the current provided in FIG. 5a.

Figure 6B:
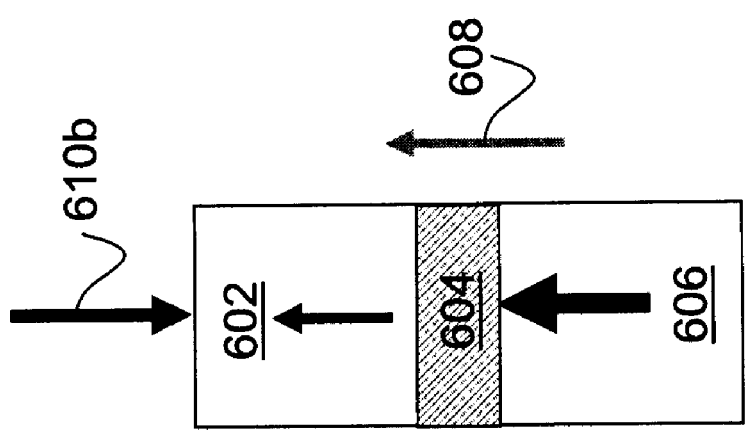
FIGS. 6a and 6b are cross-sections illustrating an embodiment of programming a magnetic element using a current in plane (CIP) configuration.
Figure 6A:
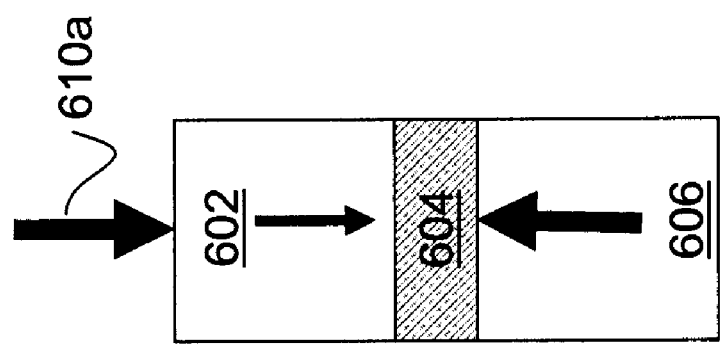

Referring now to FIGS. 6a and 6b, illustrated is a magnetic element 600 with an architecture allowing current to be driven through the magnetic element 600 in a current in plane (CIP) configuration. In a CIP configuration, the current is supplied to the magnetic element 600 such that it is parallel the magnetization vectors of the magnetic element 600. The magnetic element 600 includes a free layer 602, a spacer layer 604, and a pinned layer 606. The layers of the magnetic element 600 may be substantially similar in composition and fabrication to those of the magnetic element 100, described above with reference to FIG. 1. In an embodiment, the magnetic element 600 is a MTJ. In an alternative embodiment, the magnetic element 600 is a GMR. The magnetic element 600 may be configured such that it may be written to using STT.

FIG. 6a illustrates an embodiment of programming the magnetic element 600 such that the magnetization of the free layer 602 is made to be antiparallel that of the pinned layer 606. The free layer 602 is initially parallel to the pinned layer 606 (both magnetization vectors are pointed "up") (not shown). A current 610a is supplied to the magnetic element 600 in a direction from the free layer 602 towards the pinned layer 606. The current 610a supplied has a current density greater than Jc. As such, the magnetization of the free layer 602 is switched to be antiparallel the magnetization of the pinned layer 606.

FIG. 6b illustrates an embodiment of programming the magnetic element 600 such that the magnetization of the free layer 602 is made to be parallel that of the pinned layer 606.

The free layer 602 is initially antiparallel to the pinned layer 606 (the free layer 602 magnetization vector is pointing "down," the pinned layer is pointing "up") (not illustrated). A current 610b is supplied to the magnetic element 600 in a direction from the free layer 602 towards the pinned layer 606. The current 610b supplied may have a current density less than Jc. The current 610b is less than or equal to the current 610a. The current 610b is applied for sufficient time to heat the magnetic element 600, and in particular, the free layer 602, until the Hc of the free layer 602 is sufficiently low that the magnetization of the free layer 602 becomes dependent on the bias field 608 of the pinned layer 606. The magnetization of the free layer 602 then switches to be parallel to that of the pinned layer 606. Thus, this form of thermal programming depicted in FIG. 6b allows the use of the current to be unipolar with the current provided in FIG. 6a.

Figure 7:
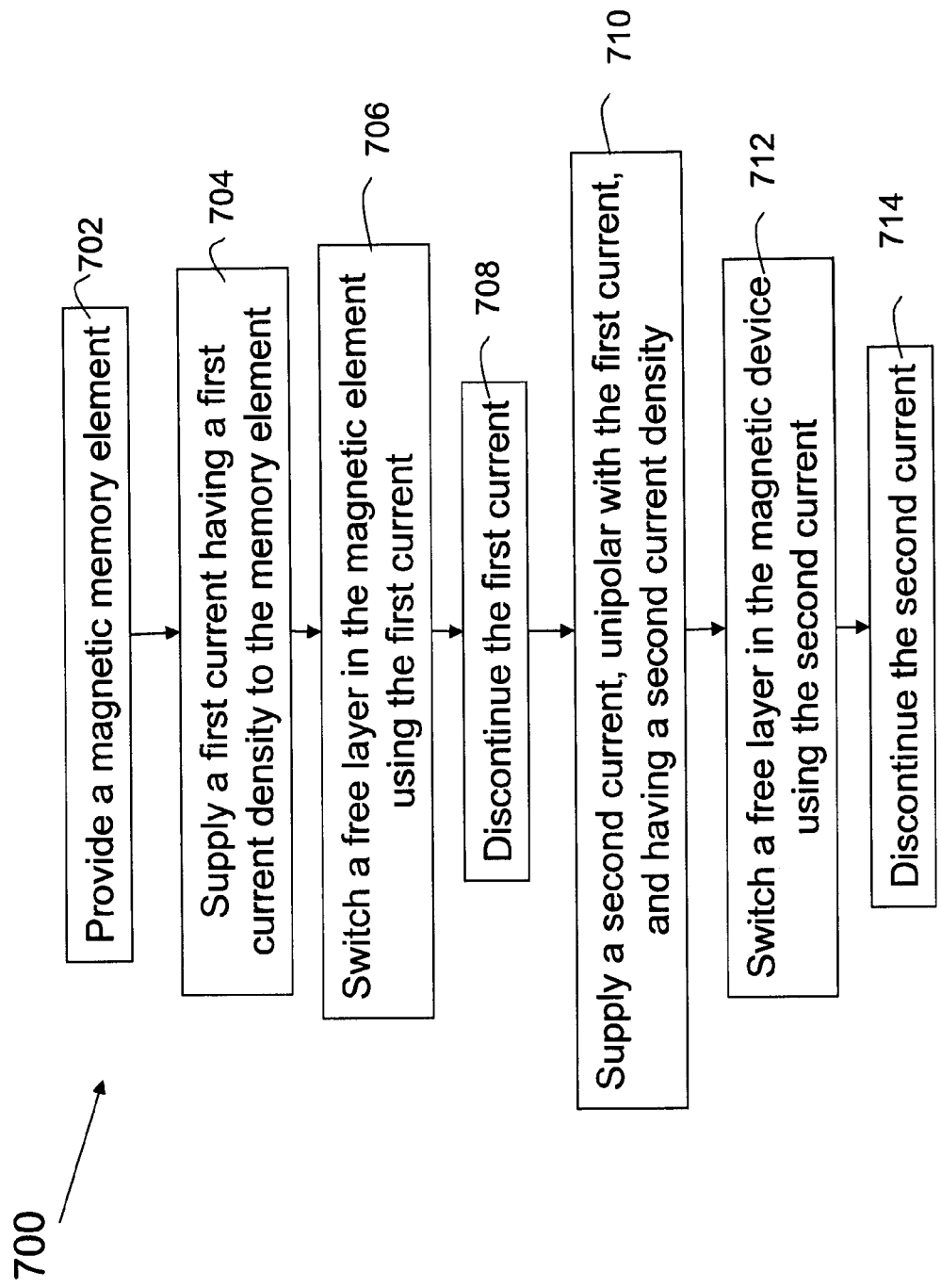
FIG. 7 is a flow chart illustrating an embodiment of a method of programming a magnetic memory element.

Referring now to FIG. 7, illustrated is an embodiment of a method 700 for programming a magnetic memory element. The method 700 begins at step 702 where a magnetic memory element is provided. The magnetic memory element provided may be the magnetic element 100, 300, 400, 500, and/or 600 described above with reference to FIGS. 1, 3a, 3b, 4a, 4b, 5a, 5b, 6a, and 6b respectively. The magnetic memory element provided includes a free layer (or storage layer) in which the direction of magnetization of the layer is free to rotate. The magnetic element may be included in a magnetic memory cell. The memory cell may be included in an array of memory cells forming a magnetic memory device. The method 700 then proceeds to step 704 where a current is supplied to the magnetic element. The current supplied is a current has a current density greater than Jc. The current is from a first direction. The method then continues to step 706 where the direction of the magnetization of the free layer of the magnetic element is switched using the current supplied in step 704. The free layer may be switched by STT. The method then continues to step 708 where the supply of the first current is discontinued. In an embodiment, the time the first current is supplied is approximately five (5) nanoseconds. In an embodiment, of the method 700 the time between the step 708 and the step 710 is no greater than approximately 300 nanoseconds. In an embodiment, in step 706, the magnetization of the free layer may be switched to be parallel the magnetization of a reference (pinned) layer also provided for in the magnetic element. In this embodiment, the parallel magnetizations provide for a low resistance state of the magnetic element.

The method then proceeds to step 710 where a second current is supplied to the magnetic element. The second current is unipolar (unidirectional) with the first current. The second current has a current density less than or equal to that of the first current. The second current may have a current density below Jc. The method 700 then continues to step 712 where the direction of the magnetization of the free layer of the magnetic element provided is switched using the second current. The magnetization vector of the free layer may be switched using a bias field. In an embodiment, the bias field is created from one or more layers in the magnetic element such as a pinned layer or synthetic pinned layer (SAFM). The applied current heats the magnetic element and in particular, the free layer of the magnetic element decreasing the Hc of the free layer. As Hc decreases, the direction of the magnetization of the free layer becomes easier to rotate. At a point, Hc is decreased such that the magnetization of the free layer becomes dependent on the bias field present. The bias field present may switch the direction of the magnetization of the free layer. The method 700 then continues to step 714 where the second current is discontinued. In an embodiment, in step 712, the magnetization of the free layer may be switched to be antiparallel the magnetization of a reference (pinned) layer also provided for in the magnetic element. In this embodiment, the antiparallel magnetizations provide for a high resistance state of the magnetic element. The currents supplied in step 704 and 710 may follow a write clock such as depicted in FIG. 3c.

The steps of the method 700 may occur in any order (such as the application of the second current prior to the first current) and may include additional steps such as, providing for reading a value stored by the magnetic element. For instance, in an embodiment, after step 708 a read current is provided to the magnetic element. The read current may determine a low resistance state of the magnetic element. This may be designated as a "1" having been stored in the magnetic element. In an embodiment, after step 714, a read current is provided to the magnetic element. The read current may determine a high resistance state of the magnetic element. This may be designated a "0" having been stored in the magnetic element. Thus, provided is a method of creating a high resistance state and a low resistance state in a magnetic element using a unipolar current flow.

Although only a few exemplary embodiments of this invention have been described in detail above, those skilled in the art will readily appreciate that many modifications are possible in the exemplary embodiments without material departing from the novel teachings and advantages of this disclosure.

Thus, the present disclosure provides a method of programming a memory array. At least one memory cell including a magnetic element is provided. At least one current source coupled to the magnetic element is provided. A unipolar current is supplied from the at least one current source to the magnetic element at a plurality of non-zero current levels.

Also provided is a method of programming a memory array. The method provides a first magnetic element and a second magnetic element. A first current source is provided coupled to the first magnetic element. A second current source is provided coupled to the second magnetic element. A first current is supplied from the first current source to the first magnetic element. The first current has a first current density and is from a first direction. A second current is supplied from the second current source to the second magnetic element. The second current has a second current density and is from the first direction.

Also provided is a method of programming a memory element. A magnetic element is provided coupled a current source. A first current pulse is supplied from the current source to the magnetic element. The first current pulse provides a low resistance state of the magnetic element. A second current pulse is provided from the current source to the magnetic element. The first current pulse and the second current pulse are unipolar. The second current pulse provides a high resistance state in the magnetic element.

What is claimed is:

1. A method of programming a memory array including a first magnetic element and a second magnetic element, the method comprising:

providing a first current source coupled to the first magnetic element and a second current source coupled to the second magnetic element;

supplying a first current from the first current source to the first magnetic element, the first current having a first current density and being from a first direction; and supplying a second current from the second current source to the second magnetic element, the second current having a second current density, different than the first current density, and being from the first direction.

2. The method of claim 1, wherein the supplying the first current provides for a low resistance state of the first magnetic element, and wherein the supplying the second current provides for a high resistance state of the second magnetic element.

3. The method of claim 1, wherein the second magnetic element includes a free layer and a pinned layer, and wherein the supplying the second current to the second magnetic element includes supplying a current until an intensity (Hc) of the free layer is sufficiently low that the magnetization of the free layer is dependent on a bias field of the pinned layer.

4. The method of claim 1, wherein the first current source is distinct from the second current source.

5. The method of claim 1, wherein the first current is parallel a direction of magnetization of a pinned layer of the first magnetic element.

6. The method of claim 1, wherein the first current is supplied for a first duration and a second current is supplied for a second duration, and wherein the first current density is higher than the second current density, and the first duration being shorter than the second duration.

7. The method of claim 6, wherein a ratio of the second duration and the first duration is no greater than 200.

8. The method of claim 1, wherein the first current further comprises a third current density, and wherein the first current density provides for a low resistance state of the first magnetic element and the third current density provides for a high resistance state of the first magnetic element.

9. A method of programming a memory array comprising:
providing at least one memory cell comprising a magnetic element;
providing at least one current source coupled to the magnetic element; and
supplying a unipolar current from the at least one current source to the magnetic element at a plurality of non-zero current levels.

10. The method of claim 9, wherein the magnetic element comprises a pinned layer, a free layer, and a spacer layer; and wherein the unipolar current is supplied to the pinned layer.

11. The method of claim 10, wherein the pinned layer includes a non-zero magnetization such that the supplying the unipolar current provides a bias field.

12. The method of claim 9, wherein the memory element comprises a magnetic field bias layer, and wherein the unipolar current is supplied to the magnetic field bias layer.

13. The method of claim 12, wherein the magnetic field bias layer is a synthetic antiferromagnet (SAFM).

14. The method of claim 10, wherein the spacer layer comprises a conductive material selected from the group consisting of Cu, Ru, Ni, and combinations thereof, the spacer layer providing a path for electrons of the supplied unipolar current.

15. The method of claim 10, wherein the spacer layer comprises an insulating material including at least one of an oxide and a nitride, the insulating material providing for tunneling of electrons of the supplied unipolar current through the spacer layer.

16. The method of claim 9, wherein the memory element comprises a thermal assistance layer, and wherein the at least one current source is electrically coupled to the thermal assistance layer.

17. The method of claim 9, wherein the supplying the unipolar current includes supplying a first current level having a current density greater than Jc and a supplying a second current level having a current density less than Jc.

18. The method claim 9, wherein the supplying the unipolar current includes supplying a first current level operable to switch a direction of magnetization of the free layer and a second current level operable to switch a direction of magnetization of the free layer.

19. The method of claim 9, wherein the supplying the unipolar current includes supplying a first current for a first duration, and supplying a second current for a second duration, and wherein the second duration is greater than the first duration.

20. A method of programming a memory element comprising:
providing a magnetic element coupled to a current source;
supplying a first current pulse from the current source to the magnetic element, wherein the first current pulse provides a low resistance state of the magnetic element; and
supplying a second, different value, current pulse from the current source to the magnetic element, wherein the first current pulse and the second current pulse are unipolar; and the second current pulse provides a high resistance state in the magnetic element.

* * * * *